United States Patent
Shieh et al.

(10) Patent No.: US 6,742,157 B2
(45) Date of Patent: *May 25, 2004

(54) DECODING SYSTEM AND METHOD IN AN OPTICAL DISK STORAGE DEVICE

(75) Inventors: Jia-Horng Shieh, Junghe (TW); Te-Wei Chen, Shindian (TW)

(73) Assignee: Acer Laboratories Inc., Taiwan (TW)

( * ) Notice: Subject to any disclaimer, the term of this patent is extended or adjusted under 35 U.S.C. 154(b) by 443 days.

This patent is subject to a terminal disclaimer.

(21) Appl. No.: 09/826,884

(22) Filed: Apr. 6, 2001

(65) Prior Publication Data

US 2002/0062469 A1 May 23, 2002

(30) Foreign Application Priority Data

Oct. 23, 2000 (TW) ........................................ 89122286 A

(51) Int. Cl.[7] ........................ H03M 13/00; H03M 13/03
(52) U.S. Cl. ........................................ 714/758; 714/785
(58) Field of Search ................................ 714/752, 755, 714/756, 758, 785

(56) References Cited

U.S. PATENT DOCUMENTS

| | | | | |
|---|---|---|---|---|
| 6,009,549 A | * | 12/1999 | Bliss et al. ................. | 714/769 |
| 6,052,815 A | * | 4/2000 | Zook .......................... | 714/758 |
| 6,158,039 A | * | 12/2000 | Cho et al. .................... | 714/769 |
| 6,167,548 A | * | 12/2000 | Yamakura .................... | 714/763 |
| 6,317,855 B1 | * | 11/2001 | Horibe ........................ | 714/752 |
| 6,543,026 B1 | * | 4/2003 | Dadurian .................... | 714/785 |

* cited by examiner

*Primary Examiner*—Albert Decady
*Assistant Examiner*—Esaw Abraham
(74) *Attorney, Agent, or Firm*—Michael D. Bednarek; Shaw Pittman LLP

(57) ABSTRACT

The present invention provides a decoding system and method for an optical disk storage device to receive and decode the data of the disk. The present invention does not need to increase the clock frequency and the bus width of the decoding system, it can effectively decrease the access times to the data buffer and the system response time by changing the structure of the conventional decoding system, in this way the present invention increases the parallel processing capability and the decoding speed of the system, thus, it can enhance the entire device to become a high speed optical storage device.

6 Claims, 7 Drawing Sheets

DECODING SYSTEM AND METHOD IN AN OPTICAL DISK STORAGE DEVICE

REFERENCE TO RELATED APPLICATION

This application claims the benefit of priority under 35U.S.C. §119(a) of Taiwan Patent Application No. 089122286, titled "Decoding System and Method in an Optical Disk Storage Device," filed on Oct. 23, 2000.

BACKGROUND OF THE INVENTION

1. Field of the Invention

This invention relates in general to a decoding system and method, and more particularly to a decoding system and method in an optical desk storage device with high decoding speed by decreasing the access times to a data buffer.

2. Description of the Related Art

Referring now to FIG. 1, it is a block diagram of a conventional decoding system in a DVD storage device. As shown in FIG. 1, a demodulator 102 reads the data stored in the disk 100 for converting 16 bit code words into 8 bit data symbols. Then, the demodulator 102 generates an ECC (Error Correction Code) block 107 and transmits the ECC block 107 to a data buffer 106 through a bus 104. The ECC block 107 comprises main data 108, a PO(parity of outer-code) 110 and a PI(parity of inner-code) 112. Main data 108 appended with the PO 110 forms an outer-code of RS(Reed Solomon), and main data 108 appended with the PO 110 and the PI 112 forms an inner-code of RS. ECC decoder 114 reads the ECC block 107 from the data buffer 106 to perform the error correction decoding along the PI direction (i.e. X direction) and PO direction (i.e. Y direction) of the ECC block 107 in turn. Then, the ECC decoder 114 writes the corrected part of the ECC block 107 into the data buffer 106. The de-scrambler and EDC(Error Detection Code)check 116 reads the corrected main data 108 stored in the data buffer 106 for de-scrambling the main data 108 and checking whether errors in the main data 108 are corrected. When the host needs the main data 108, an ATAPI(Advanced Technology Attachment Packet Interface) 118 reads the main data 108 in the data buffer 106, then de-scrambles and transmits the main data 108 to the host.

Referring to FIG. 2, it illustrates a flow chart of the conventional decoding system accessing to the data buffer in a DVD storage device. At a step 201, after performing demodulation, a demodulator 102 writes an ECC block 107 into a data buffer 106. Next, at a step 202, an ECC decoder 114 reads the ECC block 107 of the PI direction to perform the error correction decoding, then writes the corrected part of the ECC block 107 into the data buffer 106. Continuing the step 202, it flows to a step 203, the ECC decoder 114 reads the ECC block 107 of the PO direction to perform the error correction decoding, then writes the corrected part of the ECC block 107 into the data buffer 106. After finishing the step 203, the system can repeat the steps 202 and 203 to enhance the error correction capability according to the setting of the system. Then at a step 204, the de-scrambler and EDC check 116 reads the corrected main data 108 stored in the data buffer 106 for de-scrambling the main data 108 and checking whether errors in the main data 108 are corrected. When the host needs the main data 108, at a step 205, an ATAPI 118 reads the main data 108 stored in the data buffer 106, then de-scrambles and transmits the main data 108 to the host. In the preceding prior art, each module of the decoding system needs to run the above-mentioned steps in turn to finish the decoding process in a DVD storage device.

Referring now to FIG. 3, it illustrates a flow chart of decoding RS code in a conventional ECC decoder. At a stage 301, original code words in the data buffer 106 enter the stage of syndrome generation, wherein the ECC decoder 114 calculates the PI syndrome or the PO syndrome. Next, at a stage 302, the ECC decoder 114 calculates the "erasure location polynomial" according to the known erasure location, then calculates the "Forney's modified syndrome polynomial" and gets the initial value of the next stage according to the calculated syndromes and erasure location polynomial. Continuing the stage 302, at a stage 303, the ECC decoder 114 calculates the "error-erasure locator polynomial" and "error erasure evaluator polynomial" according to the initial value produced by the previous stage 302. Then, at a stage 304, a Chien search unit finds the error locations and error magnitudes. Finally, at a stage 305, the ECC decoder 114 corrects the errors in the original code words to get the correct code words and writes them into the data buffer 106.

According to FIG. 1, when the conventional decoding system performs the decoding process, each module of the system needs to access to the data buffer. If each module of the decoding system can access to the data buffer synchronously, the system can increase the decoding speed to become a high speed DVD. However, according to FIGS. 2 and 3 the ECC decoder 114 in the conventional decoding system must access to the data buffer when it performs the error correction decoding along the PI and PO directions of the ECC block each time, thereby it takes a lot of time and limits the speed of the entire DVD system for many accesses to the data buffer. Now there are several solutions for the above bottleneck: enhancing the clock frequency of the decoding system, increasing the bus width of the decoding system, and decreasing the access times to the data buffer, etc.

SUMMARY OF THE INVENTION

It is therefore an object of the invention to provide a decoding system and method for an optical disk for decreasing the access times to the data buffer. In this way, it can enhance the parallel processing capability of the decoding system and increase the decoding speed to become a high speed DVD.

In one embodiment, a demodulator reads the data from a disk to perform the demodulation and transfers the generated ECC block to an ECC decoder. Next, the ECC decoder writes the ECC block into a data buffer, then calculates the PI syndrome and the PO syndrome and writes the calculation results into a memory after reading the ECC block from a data buffer. Further, the ECC decoder performs the error correction decoding according to the syndromes stored in the memory. After the ECC decoder finishes the error correction decoding of the ECC block, a de-scrambler and EDC check reads the main data stored in the data buffer to de-scramble the main data and check whether errors are corrected. After finishing the preceding processes, the main data is transferred to the host through ATAPI when the host needs data.

In anther embodiment, a demodulator performs the demodulation and transfers the generated ECC block to an ECC decoder. Next, the ECC decoder writes the ECC block into a data buffer, then calculates the PI syndrome and the PO syndrome and writes the calculation results into a memory after reading the ECC block from a data buffer. When the ECC decoder reads the main data from the data buffer, the main data is also transferred to the first de-scrambler and EDC check. Thus, the ensuing error correction decoding along the PI and PO directions of the ECC block can ignore the part of the main data, which the EDC checking is finished. After finishing the ensuing error correction decoding, the second de-scrambler and EDC check will de-scramble the main data and check again whether errors are corrected. After finishing the preceding processes, the main data is transferred to the host through an ATAPI when the host needs data.

The foregoing is a brief description of some deficiencies in the prior art and advantages of this invention. Other features, advantages and embodiments of the invention will be apparent to those skilled in the art from the following description, accompanying drawings and appended claims.

BRIEF DESCRIPTION OF DRAWINGS

The following detailed description, given by way of examples and not intended to limit the invention to the embodiments described herein, will be best understood in conjunction with the accompanying drawings, in which.

DETAILED DESCRIPTION OF THE INVENTION

Detailed descriptions of the preferred embodiment are provided herein. It is to be understand, however, the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

Figure 3:
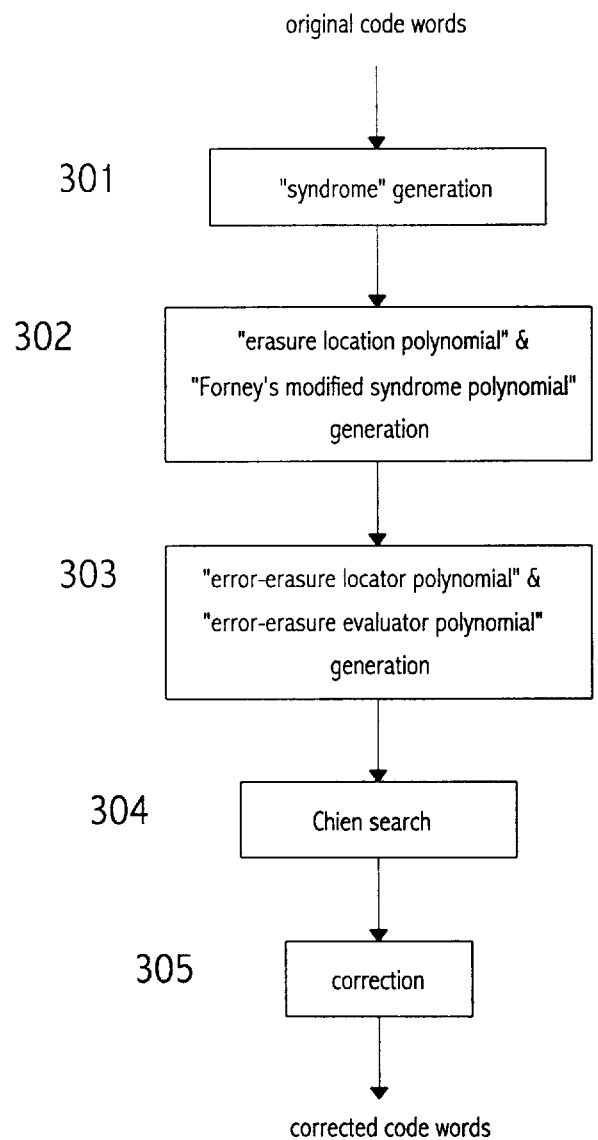
FIG. 3 illustrates a flow chart of decoding RS code in the conventional ECC decoder.

As shown in FIG. 3, no matter the ECC decoder performs the error correction decoding along the PI or PO direction of the ECC block, the first step is to generate syndromes. Assume that before performing the error correction decoding the data in one direction of the ECC block is r(X), and the data after performing the error correction decoding becomes r'(X), then r'(X)=r(X)+e(X), where the e(X) represents the error. Thus, a new syndrome after performing the error correction decoding can be shown as follows:

$$S_{k(r')}(X) = \sum_{i=0}^{n-1} r'_i \alpha^{ik} = \sum_{i=0}^{n-1} (r_i + e_i)\alpha^{ik}$$

$$= \sum_{i=0}^{n-1} r_i \alpha^{ik} + \sum_{i=0}^{n-1} e_i \alpha^{ik} = S_{k(r)}(X) + S_{k(e)}(X)$$

According to the above equation, when the decoding system performs the error correction decoding, the syndromes before error correction decoding appended with the syndrome of the error produces the new syndrome. Therefore, the ECC decoder calculates the PI syndrome and the PO syndrome before the decoding system performs the error correction decoding. Then, when the decoding system performs the error correction decoding, the ECC decoder calculates the PI syndrome of the error and adds the original syndrome of the data of the PI direction to generate a new PI syndrome; similarly, the ECC decoder calculates the syndrome of the error of the PO direction and adds the original PO syndrome of the data to generate a new PO syndrome. That is, the PI syndrome and the PO syndrome all correspond to a corrected ECC block.

Figure 1:
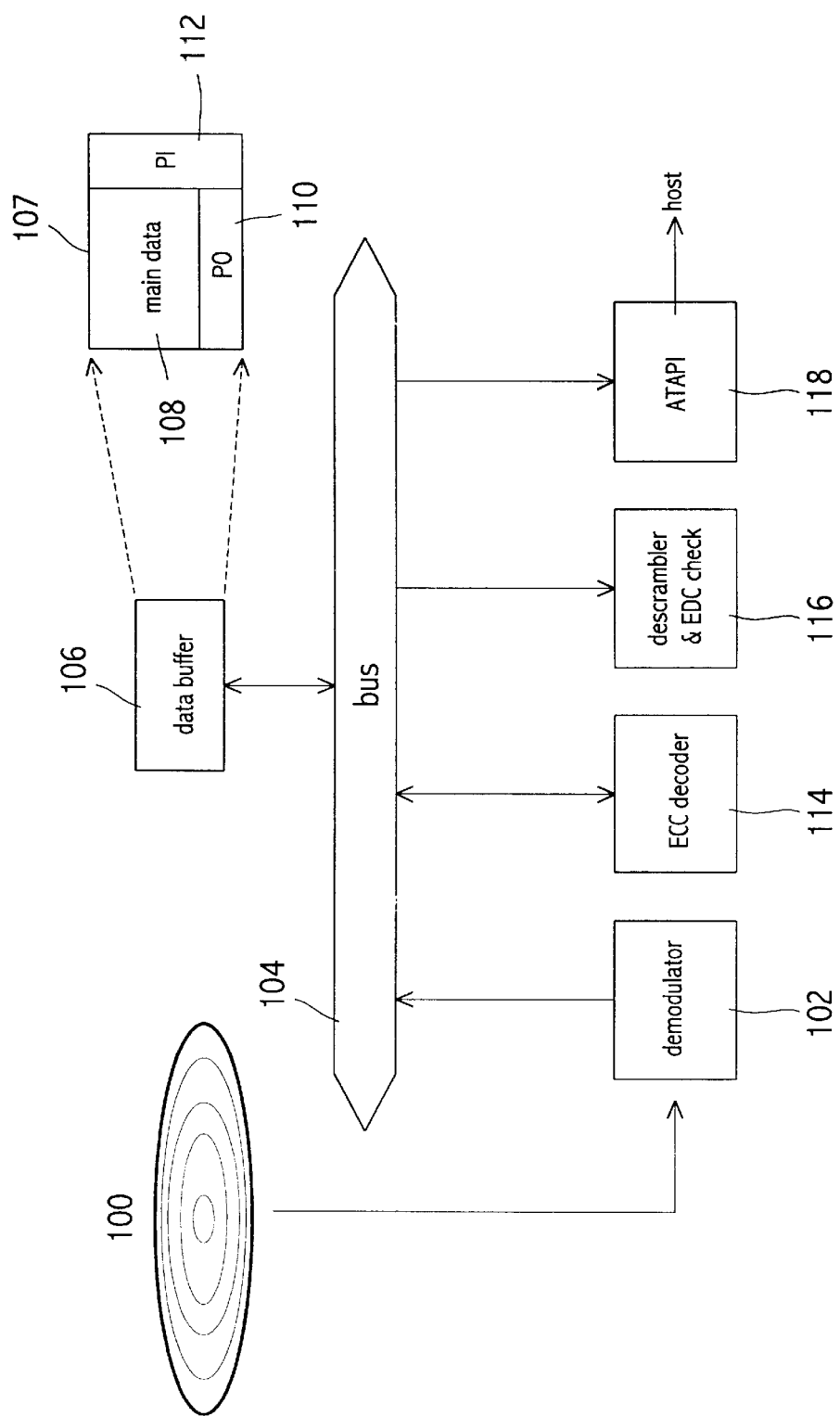
FIG. 1 illustrates a block diagram of a conventional decoding system in a DVD storage device.
Figure 2:
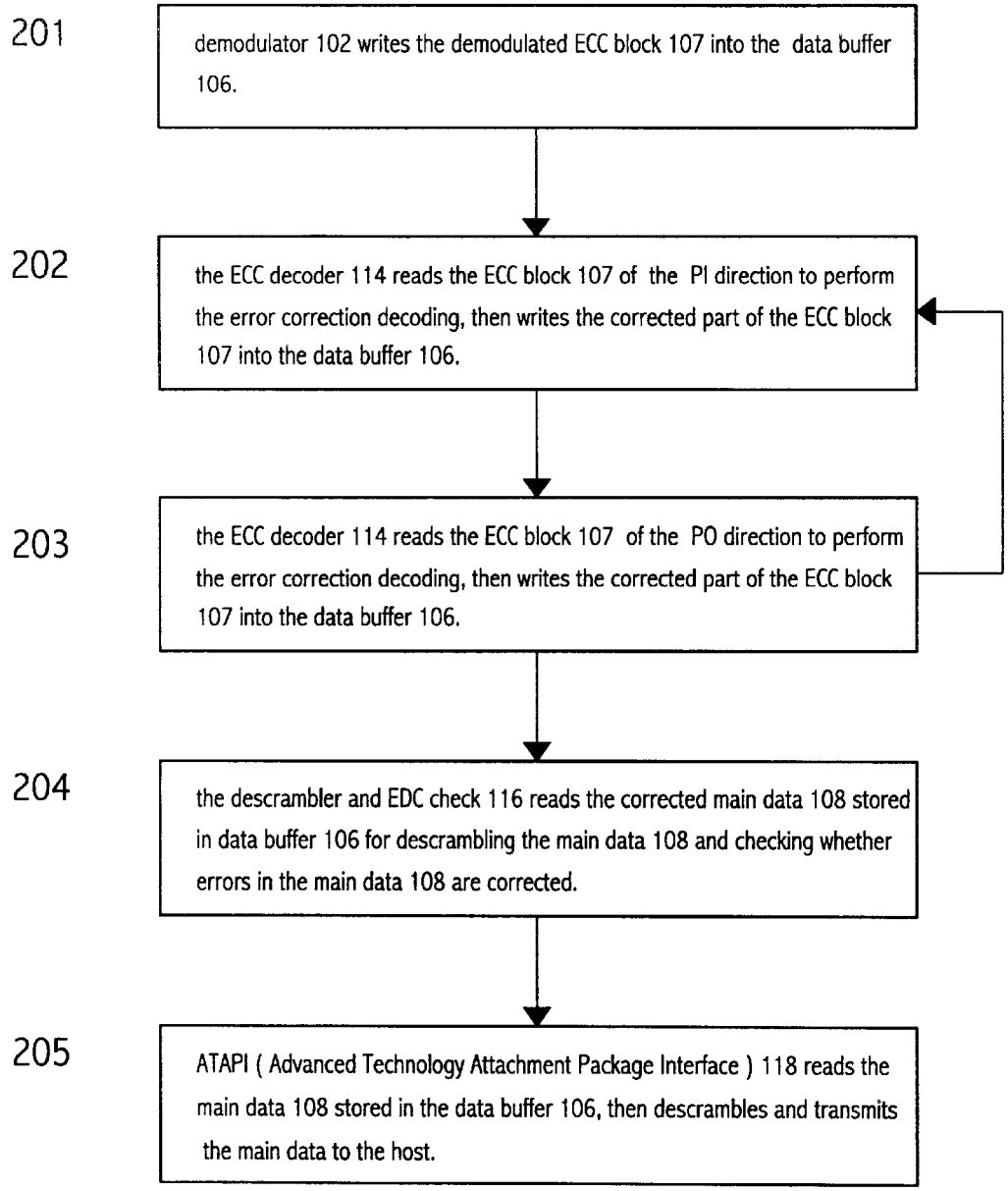
FIG. 2 illustrates a flow chart of the conventional decoding system accessing to the data buffer in a DVD storage device.
Figure 4:
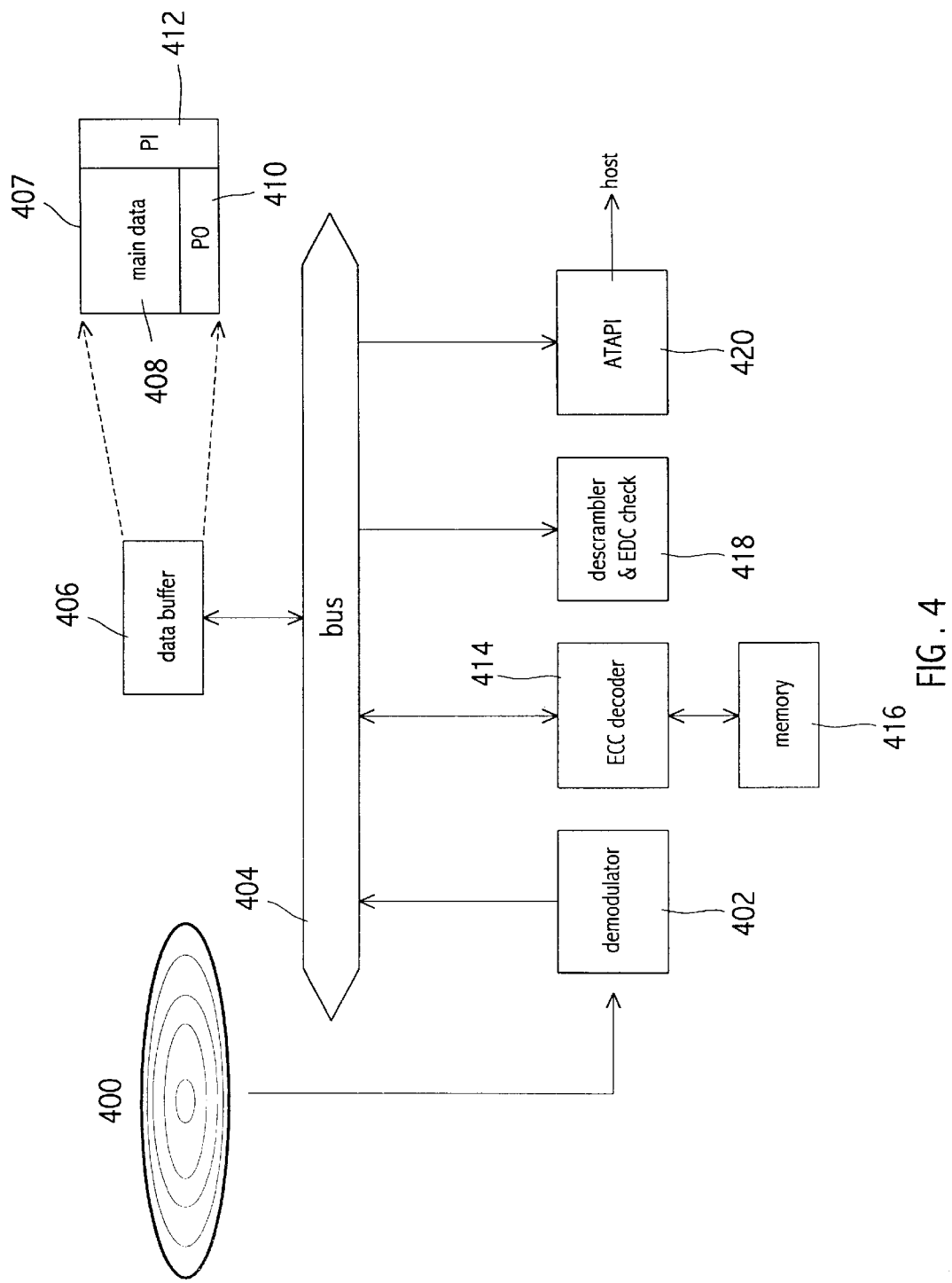
FIG. 4 illustrates a block diagram of a first embodiment of the present invention.

Turning now to FIG. 4, it illustrates a block diagram of a first embodiment of the present invention. The decoding system in FIG. 4 is similar to FIG. 1. As shown in FIG. 4, a demodulator 402 reads the data from the disk 100 to perform the demodulation then transfers the generated ECC block to the ECC decoder 414, wherein the ECC block 407 comprises main data 108, a PO 410 and a PI 412. Then, the ECC decoder 414 writes the ECC block 407 into a data buffer 406. The ECC decoder 414 calculates the PI syndrome and the PO syndrome and writes the calculation results into a memory 416 after reading the ECC block 407 from a data buffer 406. At this time the ECC decoder 414 will calculate both the PI syndrome and the PO syndrome simultaneously, then writes the corrected syndromes into the memory 416 and writes the corrected part of the main data 408 into the data buffer 406. Then, the ECC decoder 114 performs the error correction decoding along the PI and PO directions of the ECC block 407 according to the syndromes stored in the memory 416. Since the host needs only the main data 408, the ECC decoder 414 does not need to update the PI 412 and PO 410 but the PI syndrome and the PO syndrome when errors occur in the PI 412 and PO 410. Therefore, it saves time for the decoding system to access to the data buffer 406. After the ECC decoder 414 finishes the error correction decoding of the ECC block 407, the de-scrambler and EDC check 418 reads the main data 408 stored in the data buffer 406 to de-scramble the main data 408 and check whether errors are corrected. After finishing the preceding processes, the main data 408 is transferred to the host through the ATAPI 420 when the host needs data.

Since the reading direction of the main data 408 for the de-scrambler and EDC check 418 is the same as the ECC decoder 414, the de-scrambler and EDC check 418 can perform the de-scrambling and EDC checking simultaneously when the ECC decoder 414 transfers the main data 408 to the data buffer 406. Thus, referring now to FIG. 5, it illustrates a block diagram of a second embodiment of the present invention. When the ECC decoder 514 reads the main data 508 from the data buffer 506, the main data 508 is also transferred to the first de-scrambler and EDC check 518. The ensuing error correction decoding along the PI and PO directions of the ECC block 507 can ignore the part of the main data 508, which the EDC checking is finished, so that it can avoid occurring errors during the ensuing decoding process. After finishing the ensuing error correction decoding along the PI and PO directions of the ECC block 507, the second de-scrambler and EDC check 520 will de-scramble the main data 508 and check again whether errors are corrected.

Figure 5:
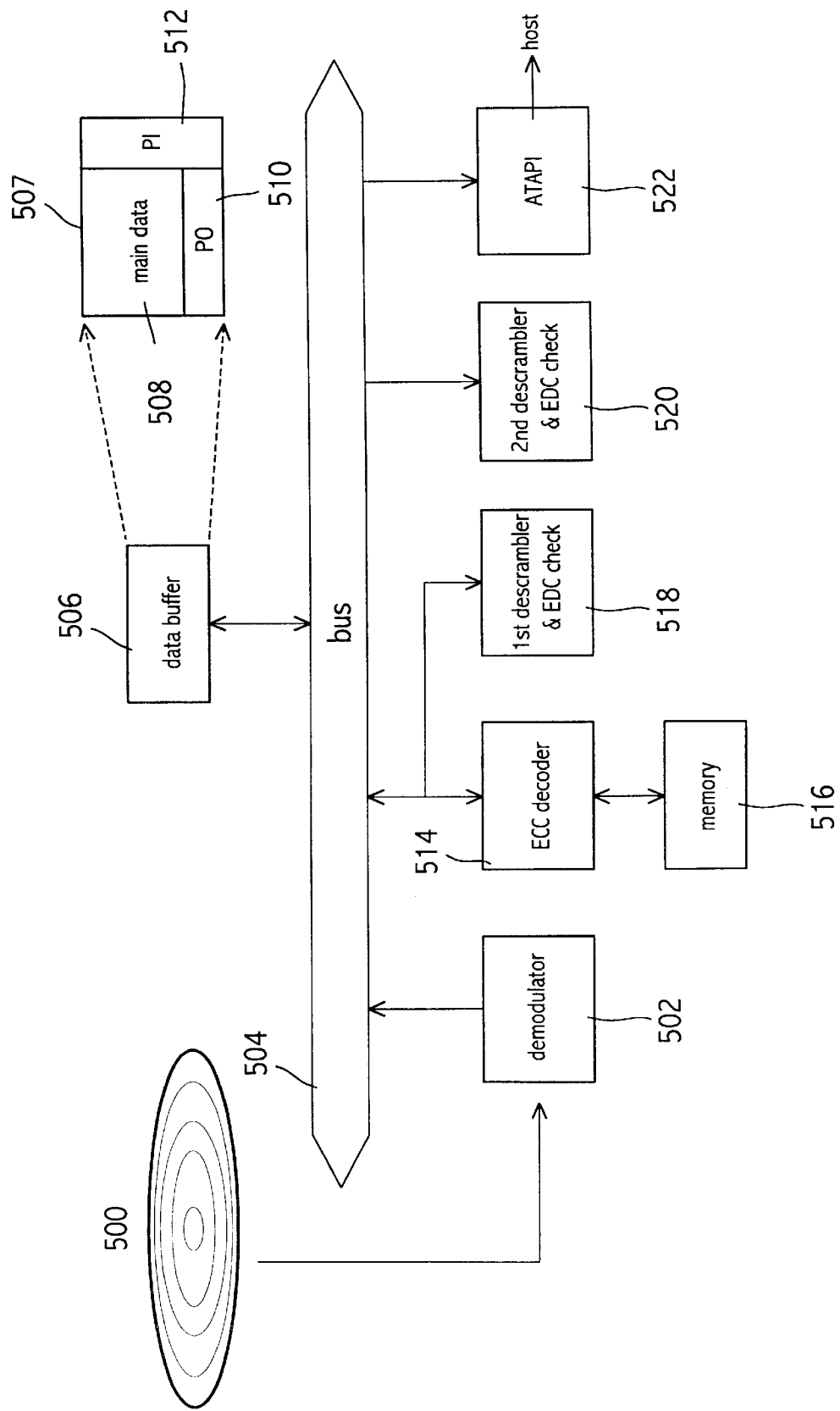
FIG. 5 illustrates a block diagram of a second embodiment of the present invention.
Figure 6:
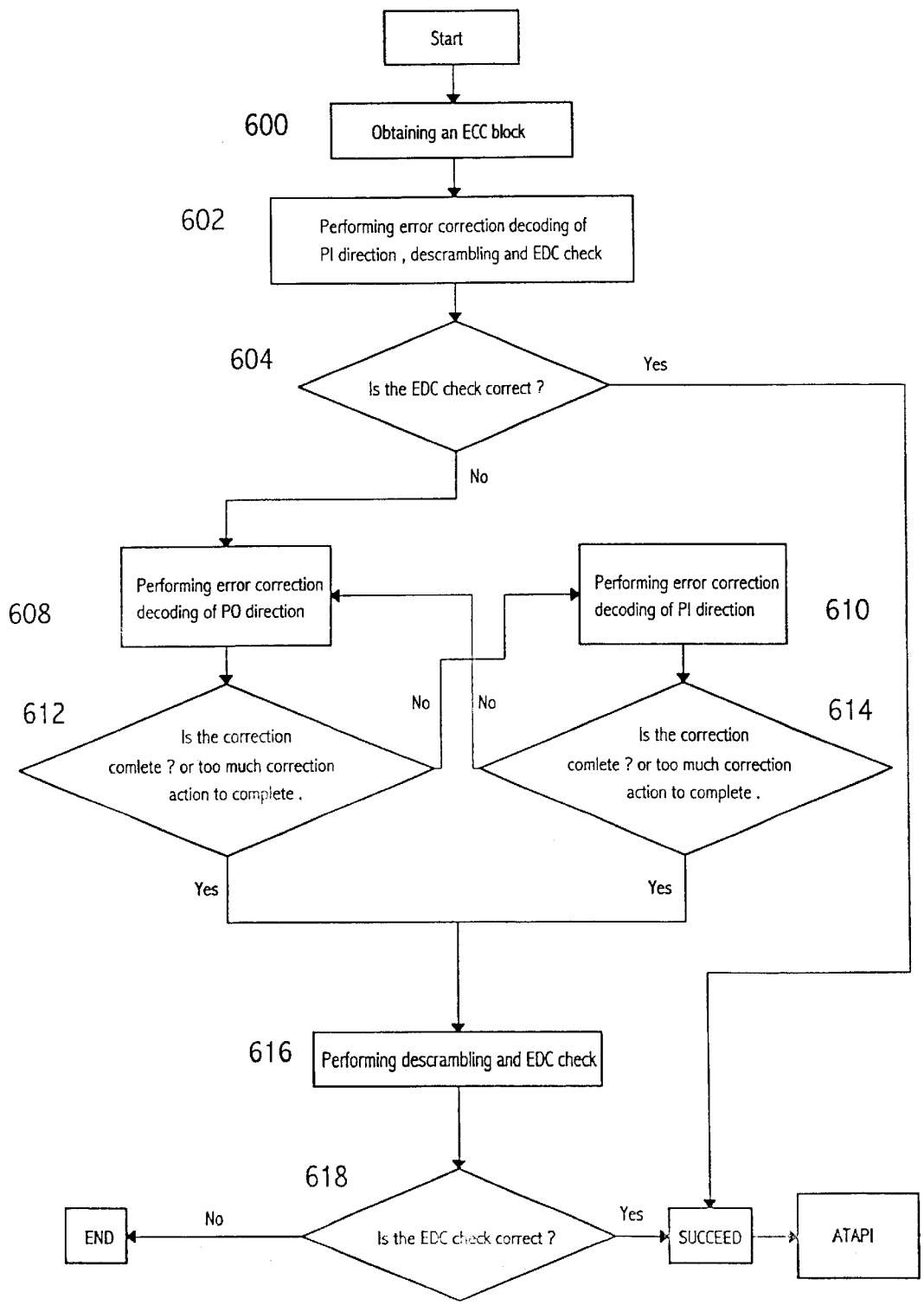
FIG. 6 illustrates a flow chart of the decoding process in FIG. 5.

Referring now to FIG. 6, it is a flow chart of the decoding process in FIG. 5. At a step 600, the ECC decoder 514 gets the ECC block 507 from the data buffer 506. Then at a step 602, the ECC decoder 514 performs the error correction decoding of the PI direction and simultaneously the first de-scrambler and EDC check 518 performs de-scrambling and EDC checking. The process flows to a step 604, the decoding system judges whether the EDC check is correct. If so, the decoding process is successful. If not, the process proceeds to a step 608. At the step 608, the ECC decoder 514 performs the error correction decoding of the PO direction. After finishing the step 608, the process proceeds to a step 612. It is determined whether the process of the error correction decoding is completed, or the error correction decoding is performed too many times to correct the errors. If so, the process proceeds to a step 616. If not, the process proceeds to a step 610. At the step 610, the ECC decoder 514 performs the error correction decoding of the PI direction. After finishing the step 610, the process proceeds to a step 614. It is determined whether the process of the error correction decoding is completed, or the error correction decoding is performing too many times to correct the errors. If so, the process proceeds to a step 616. If not, the process proceeds to a step 608. At the step 616, the second de-scrambler and EDC check 520 de-scrambles the main data 508, which EDC checking is not finished yet in the step 602 and then checking again whether errors in the main data 508 being corrected. Further, at a step 618, the decoding system judges whether the EDC check is correct. If so, the decoding process is successful. That means the ECC block 507 is correct and the main data 508 can be transferred to the host. If not, the process is failed. That is the ECC block 507 is not correct.

Figure 7:
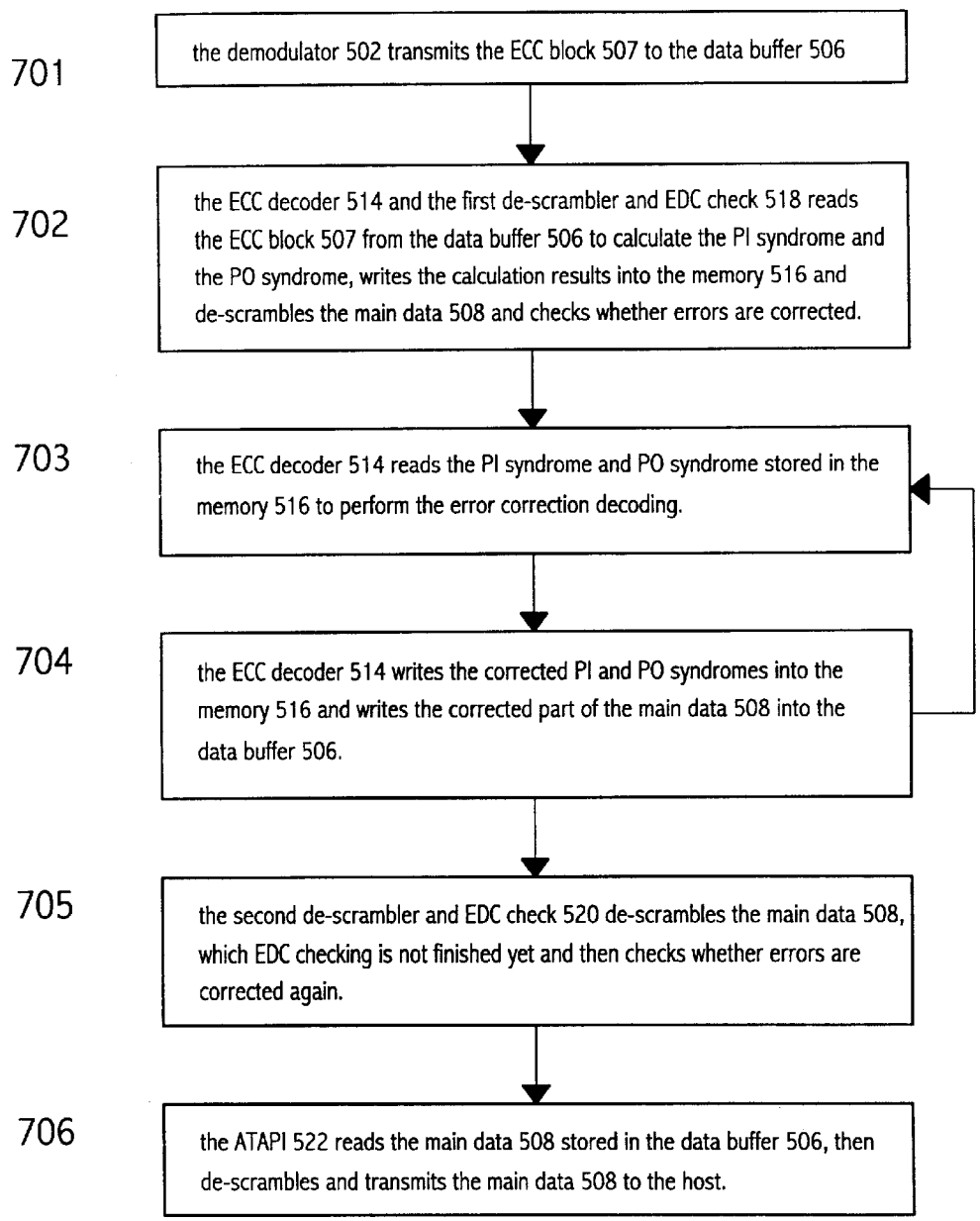
FIG. 7 illustrates a flow chart of the decoding system in FIG. 5 accessing to the data buffer.

To explain the decoding process in FIG. 6 more clearly, referring now to FIG. 7. It is a flow chart of the decoding system in FIG. 5 accessing to the data buffer. The process is as follows: First, at a step 701, the demodulator 502 transmits the ECC block 507 to the data buffer 506. Second, at a step 702, the ECC decoder 514 and the first de-scrambler and EDC check 518 reads the ECC block 507 from the data buffer 506, where the ECC decoder 514 calculates the PI syndrome and the PO syndrome and writes the calculation results into the memory 516 to perform the error correction decoding of the PI direction, while the de-scrambler and EDC check 518 de-scrambles the main data 508 and checks whether errors are corrected. Afterward, at a step 703, the ECC decoder 514 reads the PI syndrome and the PO syndrome stored in the memory 516 to perform the error correction decoding of the ECC block 507, which the EDC checking is not finished. Continuing the step 703, the process flows to a step 704, the ECC decoder 514 writes the corrected PI syndrome and the corrected PO syndrome into the memory 516 and writes the corrected part of the main data 508 into the data buffer 506. After finishing the step 704, the system can repeat the steps 703 and 704 to enhance the error correction capability according to the setting of the system. After finishing the step 704, at a step 705, the second de-scrambler and EDC check 520 de-scrambles the main data 508, which EDC checking is not finished yet and then checks whether errors are corrected again. When the host needs the main data 508, the ATAPI 522 reads the main data 508 stored in the data buffer 506, then de-scrambles and transmits the main data 508 to the host at a step 708.

According to FIG. 4 to FIG. 7, during the decoding process of the present invention the ECC decoder reads the main data from the data buffer only one time for calculating the PI syndrome and the PO syndrome. Afterward, by calculating the syndrome of the error the ECC decoder does not access to the data buffer when updating the PI syndrome and the PO syndrome. Thus, it can largely decrease the access times to the data buffer. Besides, the ECC decoder of the present invention can be a RSPC(Reed Solomon Product Code) structure. The data buffer can be a DRAM, and the scale thereof can be about 512 k bytes, while the memory can be a SRAM, and the scale thereof can be about 5 k bytes. However, the scales and the types of the data buffer and the memory are not limited to the preceding descriptions. In comparison with the conventional decoding system, the decoding system of the present invention only increases one memory. No need to increase the clock frequency and the bus width of the decoding system, it can effectively decrease the access times to the data buffer and the system response time, and increase the parallel process capability and the speed of the decoding, thus, it can become a high speed optical storage device, such as a DVD.

While the invention has been described with reference to various illustrative embodiments, the description is not intended to be construed in a limiting sense. Various modifications of the illustrative embodiments, as well as other embodiments of the invention, will be apparent to those skilled in the art upon reference to this description. It is therefore contemplated that the appended claims will cover any such modifications or embodiments as may fall within the scope of the invention defined by the following claims and their equivalents.

What is claimed is:

1. A decoding system for receiving and decoding data from an optical disk, comprising:
   a demodulator for receiving and demodulating data from the disk to generate an ECC (Error Correction Code) block that comprises main data, a PI (Parity of Inner-code), and a PO (Parity of Outer-code);
   a data buffer for storing said ECC data;
   a memory for storing a PI syndrome and a PO syndrome;
   an ECC decoder for performing error correction decoding of said ECC block;
   a first de-scrambler and EDC (Error Detection Code) check for de-scrambling said main data stored in said data buffer and checking whether errors in said main data being corrected;
   a second de-scrambler and EDC check for de-scrambling said main data which EDC checking is not finished yet and then checking again whether errors in said main data being corrected; and
   an ATAPI (Advanced Technology Attachment Packet Interface) for reading said main data stored in said data buffer, de-scrambling and transmitting said main data to the host.

2. The decoding system as claimed in claim 1 wherein said demodulator writes said ECC block into said data buffer, then said ECC block is transferred from said data bufferto said ECC decoder and said first de-scrambler and EDC check.

3. The decoding system as claimed in claim 1 wherein said ECC decoder calculates said PI syndrome and said PO syndrome and writes the calculation results into said memory; then reads said PI syndrome and said PO syndrome from said memory to perform the error correction decoding along the PI and PO directions of said ECC block, afterward said ECC decoder writes the corrected PI syndrome and the corrected PO syndrome into said memory and writes the corrected part of said main data into said data buffer simultaneously.

4. The decoding system as claimed in claim 1 wherein said demodulator converts M bit code words into N bit data symbols (M>N).

5. The decoding system as claimed in claim 1 wherein said data buffer can be a DRAM (Dynamic Random Access Memory).

6. A decoding system as claimed in claim 1 wherein said memory can be a SRAM (Static Random Access Memory).

* * * * *